United States Patent
Yang et al.

(10) Patent No.: US 9,892,915 B2
(45) Date of Patent: Feb. 13, 2018

(54) HARD MASK COMPOSITION, CARBON NANOTUBE LAYER STRUCTURE, PATTERN FORMING METHOD, AND MANUFACTURING METHOD OF SEMICONDUCTOR DEVICE

(71) Applicant: SAMSUNG ELECTRONICS CO., LTD., Suwon-si, Gyeonggi-do (KR)

(72) Inventors: Seung Yun Yang, Miryang-si (KR); Seung Hyun Lee, Busan (KR); Kyoung Sil Park, Seongnam-si (KR); Yool Kang, Yongin-si (KR); Yi Seul Kim, Daejeon (KR); Yun Seok Choi, Hwaseong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 15/285,570

(22) Filed: Oct. 5, 2016

(65) Prior Publication Data
US 2017/0186602 A1    Jun. 29, 2017

(30) Foreign Application Priority Data
Dec. 24, 2015    (KR) .................. 10-2015-0185961

(51) Int. Cl.
| H01L 21/311 | (2006.01) |
| H01L 21/027 | (2006.01) |
| H01L 21/02 | (2006.01) |
| H01L 21/308 | (2006.01) |

(52) U.S. Cl.
CPC .... H01L 21/0271 (2013.01); H01L 21/02115 (2013.01); H01L 21/02282 (2013.01); H01L 21/02359 (2013.01); H01L 21/3081 (2013.01)

(58) Field of Classification Search
USPC ........................................ 438/694
See application file for complete search history.

(56) References Cited

U.S. PATENT DOCUMENTS

| 7,911,034 B2 | 3/2011 | Gu et al. |
| 7,927,961 B2 | 4/2011 | Park |
| 2014/0124186 A1* | 5/2014 | Suwa ............. F28F 21/089 165/185 |

FOREIGN PATENT DOCUMENTS

| JP | 2007-188925 | 7/2007 |
| KR | 0365727 | 12/2002 |
| KR | 2006-0018466 A | 3/2006 |
| KR | 2008-0025818 A | 3/2008 |
| KR | 1034346 | 6/2011 |

(Continued)

*Primary Examiner* — Roberts Culbert
(74) *Attorney, Agent, or Firm* — Volentine & Whitt, PLLC

(57) ABSTRACT

A manufacturing method of a semiconductor device includes forming a hard mask layer on a semiconductor substrate using a hard mask composition. Hard mask patterns are formed by patterning the hard mask layer. Semiconductor patterns are formed by etching the semiconductor substrate using the hard mask patterns. The hard mask composition includes a plurality of first carbon nanotubes (CNTs) having a first length, a plurality of second CNTs having a second length, which is at least 3 times the first length, and a dispersing agent in which the first CNTs and the second CNTs are dispersed. The total mass of the first CNTs is 1 to 2.5 times the total mass of the second CNTs.

13 Claims, 8 Drawing Sheets

(56) References Cited

FOREIGN PATENT DOCUMENTS

KR          1088815       11/2011
KR     2012-0073819  A     7/2012

* cited by examiner

HARD MASK COMPOSITION, CARBON NANOTUBE LAYER STRUCTURE, PATTERN FORMING METHOD, AND MANUFACTURING METHOD OF SEMICONDUCTOR DEVICE

This application claims priority to Korean Patent Application No. 10-2015-0185961 filed on Dec. 24, 2015 in the Korean Intellectual Property Office, the disclosure of which is incorporated herein by reference in its entirety.

BACKGROUND

1. Technical Field

The present disclosure relates to a hard mask composition, a carbon nanotube (CNT) layer structure, a pattern forming method, and a manufacturing method of a semiconductor device, and more particularly, to a hard mask composition comprising CNTs, and a CNT layer structure, a pattern forming method, and a manufacturing method of a semiconductor device, using the hard mask composition.

2. Description of the Related Art

Semiconductor devices have evolved to be able to operate at high speed at a low voltage, and processes of manufacturing semiconductor devices have been developed to be capable of increasing the integration density of semiconductor devices. Thus, highly-scaled, highly-integrated semiconductor device patterns may be formed to have a fine width and to be spaced at a fine pitch.

To realize semiconductor patterns having a fine linewidth, photoresist patterns also having a fine linewidth need to be formed on a hard mask layer. The hard mask layer is supposed to endure an etching process for transferring patterns from a patterned resist layer onto an etching target therebelow.

Accordingly, in order to form fine patterns on the hard mask layer, the hard mask layer is not only required to have high etching durability, but the control of the thickness of the hard mask layer also needs to be facilitated.

SUMMARY

Example embodiments of the present disclosure provide a hard mask composition whose thickness is easy to control and which has improved etching durability.

Example embodiments of the present disclosure also provide a pattern forming method which is capable of forming fine patterns.

Example embodiments of the present disclosure also provide a manufacturing method of a semiconductor device, which involves forming fine patterns.

Example embodiments of the present disclosure also provide a hard mask composition, a carbon nanotube (CNT) layer structure, a pattern forming method, and a manufacturing method of a semiconductor device, which all have improved reliability.

However, example embodiments of the present disclosure are not restricted to those set forth herein. The above and other example embodiments of the present disclosure will become more apparent to one of ordinary skill in the art to which the present disclosure pertains by referencing the detailed description of the present disclosure given below.

According to an example embodiment of the present disclosure, a manufacturing method of a semiconductor device includes forming a hard mask layer on a semiconductor substrate using a hard mask composition. Hard mask patterns are formed by patterning the hard mask layer. Semiconductor patterns are formed by etching the semiconductor substrate using the hard mask patterns. The hard mask composition includes a plurality of first carbon nanotubes (CNTs) having a first length, a plurality of second CNTs having a second length, which is at least 3 times the first length, and a dispersing agent in which the first CNTs and the second CNTs are dispersed. The total mass of the first CNTs is 1 to 2.5 times the total mass of the second CNTs.

According to an example embodiment of the present disclosure, a pattern forming method includes forming a hard mask layer on a target layer using a hard mask composition, forming hard mask patterns by patterning the hard mask layer, and forming fine patterns by etching the target layer using the hard mask patterns. The hard mask composition includes a plurality of first CNTs having a first length, a plurality of second CNTs having a second length, which is at least 3 times the first length, and a dispersing agent in which the first CNTs and the second CNTs are dispersed. The total mass of the first CNTs is 1 to 2.5 times the total mass of the second CNTs.

An example embodiment of the present disclosure provides a hard mask composition including a plurality of first CNTs having a first length, a plurality of second CNTs having a second length, which is at least 3 times the first length, and a dispersing agent in which the first CNTs and the second CNTs are dispersed. The total mass of the first CNTs is 1 to 2.5 times the total mass of the second CNTs.

An example embodiment of the present disclosure provides a CNT layer structure including a base and a CNT layer deposited on the base. The CNT layer comprises a plurality of first CNTs having a first length and a plurality of second CNTs having a second length, which is at least 3 times the first length. The total mass of the first CNTs is 1 to 2.5 times the total mass of the second CNTs.

According to an example embodiment of the present disclosure provides a manufacturing method of a semiconductor device includes dispersing a plurality of first carbon nanotubes (CNTs) having a first length and a plurality of second CNTs having a second length, different form the first length, within a dispersing agent to produce a hard mask composition. A layer of the hard mask composition is formed on a semiconductor substrate.

Other features and aspects will be apparent from the following detailed description, the drawings, and the claims.

DETAILED DESCRIPTION OF THE EMBODIMENTS

Figure 1:
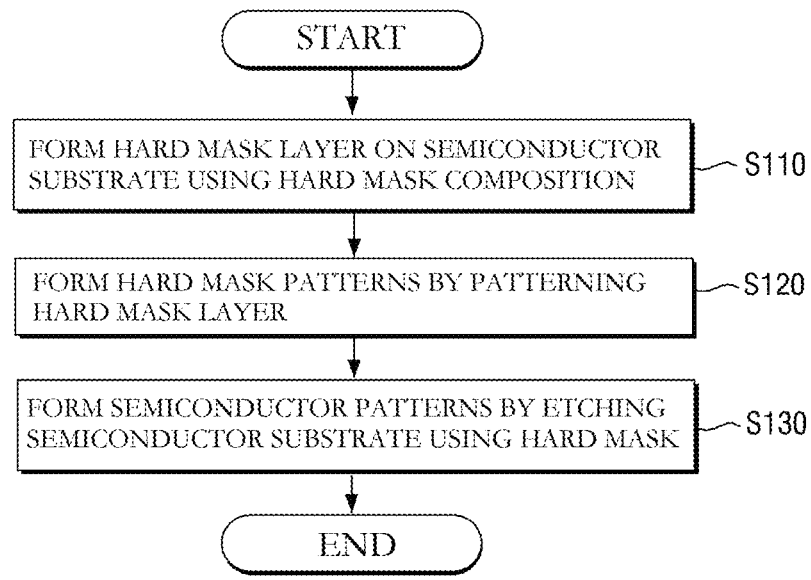
FIG. 1 is a flowchart illustrating a manufacturing method of a semiconductor device, according to some example embodiments of the present disclosure.

Advantages and features of the present disclosure and methods of accomplishing the same may be understood more readily by reference to the following detailed description of preferred embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the disclosure to those skilled in the art, and the present disclosure will only be defined by the appended claims. In the drawings, the thickness of layers and regions are exaggerated for clarity.

The present disclosure relates to a hard mask composition comprising a carbon nanotube (CNT) structure, and a pattern forming method and a manufacturing method of a semiconductor device using the hard mask composition. The CNT structure may be one of CNTs, graphene, and fullerene. In the following description, it is assumed that the CNT structure is CNTs, but the present disclosure is not limited thereto.

CNTs are a new material have hexagons of 6 carbon atoms connected with one another in the form of a tube. More specifically, CNTs are basically cylinders obtained by rolling up carbon sheets having a honeycomb shape formed by 3 carbon atoms combined with one another.

CNTs have a diameter of 0.5 nm to 10 nm, have a similar electric conductivity to that of copper (Cu), have a similar thermal conductivity to that of diamond, and are 100 times stronger than steel. Carbon fibers can be broken if they are deformed only by 1%, but CNTs may still be robust even if they are deformed by 15%. CNTs may become conductors or semiconductors depending on the diameter thereof and have thus been highlighted as a next-generation semiconductor material.

CNTs include single-wall CNTs, double-wall CNTs, thin multiwall CNTs, and multiwall CNTs.

Further descriptions of CNTs will be omitted, and instead, example embodiments of the present disclosure using CNTs will hereinafter be described.

A manufacturing method of a semiconductor device, according to some example embodiments of the present disclosure, will hereinafter be described.

FIG. 1 is a flowchart illustrating a manufacturing method of a semiconductor device, according to some example embodiments of the present disclosure. FIGS. 2 and 5 through 12 are schematic views or photos for explaining the manufacturing method according to some example embodiments of the present disclosure.

Referring to FIG. 1, the manufacturing method according to some example embodiments of the present disclosure includes forming a hard mask layer (S110) using a hard mask composition, forming hard mask patterns (S120) by patterning the hard mask layer, and forming semiconductor patterns (S130) by etching a semiconductor substrate using the hard mask patterns.

Figure 2:
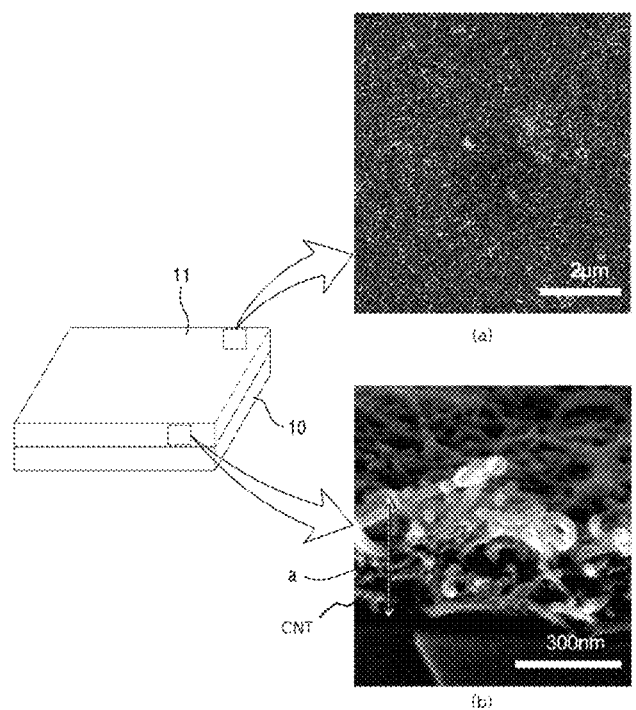
FIGS. 2 and 5 through 12 are schematic views or photos for explaining the manufacturing method according to some example embodiments of the present disclosure.

Referring to FIGS. 1 and 2, a hard mask layer 11 is formed on a semiconductor substrate 10 (S110) using a hard mask composition.

The semiconductor substrate 10 may be formed of a semiconductor material, such as Si, Ge, SiGe, GaP, GaAs, SiC, SiGeC, InAs and InP, but the present disclosure is not limited thereto. If the semiconductor layer 10 is an etching target on which to form patterns, the semiconductor substrate 10 may also be referred to as a target layer.

The hard mask layer 11 may include a CNT structure comprising CNTs. The hard mask layer 11 may be formed on the semiconductor substrate 10 through spin coating.

If the hard mask layer 11 is a CNT layer, the semiconductor substrate 10 may form a CNT layer structure together with the CNT layer, but the present disclosure is not limited thereto.

FIG. 2($a$) is an enlarged photo of the top surface of the hard mask layer 11, and FIG. 2($b$) is an enlarged photo of a side of the hard mask layer 11. Referring to FIG. 2($a$), the hard mask layer 11 has a uniform surface. Referring to FIG. 2($b$), the hard mask layer 11 has a structure in which CNTs are tangled up, and has a thickness of 300 nm.

The hard mask layer 11 may be formed by spin-coating a hard mask composition on the semiconductor substrate 10 at a speed of 2000 rpm and removing a dispersing agent contained in the hard mask composition in a vacuum oven at a temperature of 120° C., but the present disclosure is not limited thereto.

The hard mask composition will hereinafter be described.

Figure 3A:
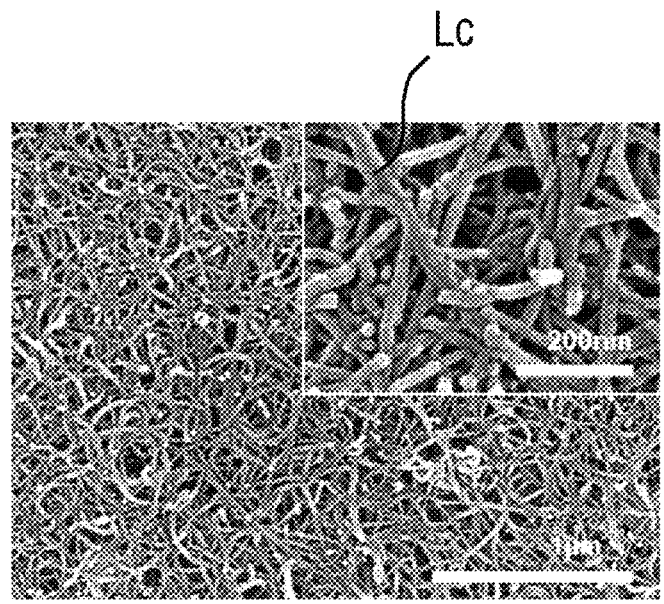
FIGS. 3A and 3B are electron micrographs of CNTs contained in a hard mask composition according to some example embodiments of the present disclosure.
Figure 3B:
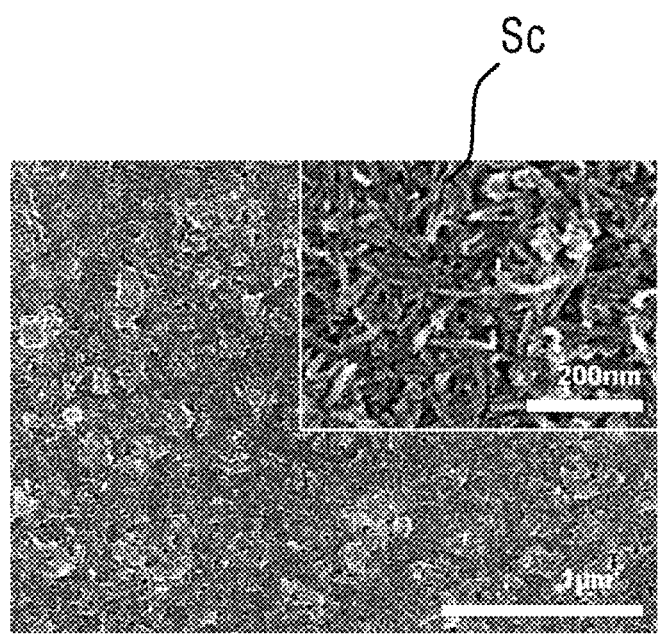

FIGS. 3A and 3B are electron micrographs of CNTs contained in a hard mask composition according to some example embodiments of the present disclosure.

More specifically, FIG. 3A shows second CNTs Lc contained in the hard mask composition according to some example embodiments of the present disclosure, and FIG. 3B shows first CNTs Sc contained in the hard mask composition according to some example embodiments of the present disclosure.

Referring to FIGS. 3A and 3B, the second CNTs Lc are relatively longer than the first CNTs Sc.

The hard mask composition according to some example embodiments of the present disclosure may comprise the first CNTs Sc, which have a first length, the second CNTs Lc, which have a second length, and a dispersing agent in which the first CNTs Sc and the second CNTs Lc are dispersed.

For example, the first length may be smaller than the second length, and the second length may be at least 3 times the first length. However, the present disclosure is not limited to this example. That is, in another example, the first length and the second length may be similar to each other. In other words, the first CNTs Sc may be identical to the second CNTs Lc.

For example, the first length may be 150 nm to 300 nm, and the second length may be 1 μm to 10 μm. However, the present disclosure is not limited to this example.

The total mass of the first CNTs Sc may be 1 to 2.5 times the total weight of the second CNTs Lc. That is, the amount of the first CNTs Sc in the hard mask composition according to some example embodiments of the present disclosure may be larger than the amount of the second CNTs Lc in the hard mask composition according to some example embodiments of the present disclosure.

Since the hard mask composition according to some example embodiments of the present disclosure contains a relatively large amount of the first CNTs Sc, which are shorter than the second CNTs Lc, the first CNTs Sc may effectively fill the gaps among the second CNTs Lc. Accordingly, a hard mask layer 11 having a uniform surface, as shown in FIG. 2(a), may be formed using the hard mask composition according to some example embodiments of the present disclosure.

For example, as mentioned above, if the second length is maintained to be at least 3 times the first length and the total weight of the first CNTs Sc is maintained to be 1 to 2.5 times the total weight of the second CNTs Lc, a hard mask layer 11 having a coating uniformity of 50 Å to 100 Å may be formed.

That is, in a case in which the second length is at least 3 times the first length, the first CNTs Sc may effectively fill the gaps among the second CNTs Lc, and if the total weight of the first CNTs Sc is maintained to be 1 to 2.5 times the total weight of the second CNTs Lc for more effective filling of the gaps among the second CNTs Lc, a hard mask layer 11 having a high surface uniformity may be formed.

Accordingly, in a pattern forming process, the uniformity of patterns may be improved, and thus, the reliability of both a semiconductor device and a manufacturing method of the semiconductor device may be improved.

The dispersing agent contained in the hard mask composition according to some example embodiments of the present disclosure may be an N-methylpyrrolidone (NMP), but the present disclosure is not limited thereto.

The hard mask composition according to some example embodiments of the present disclosure may also comprise a polymer binder.

Figure 4A:
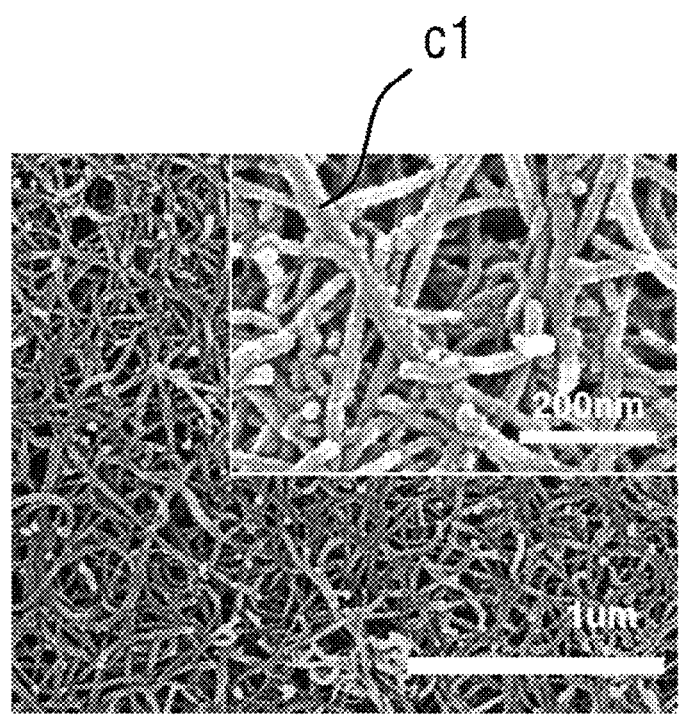
FIGS. 4A and 4B are electron micrographs for explaining a polymer binder contained in the hard mask composition according to some example embodiments of the present disclosure.
Figure 4B:
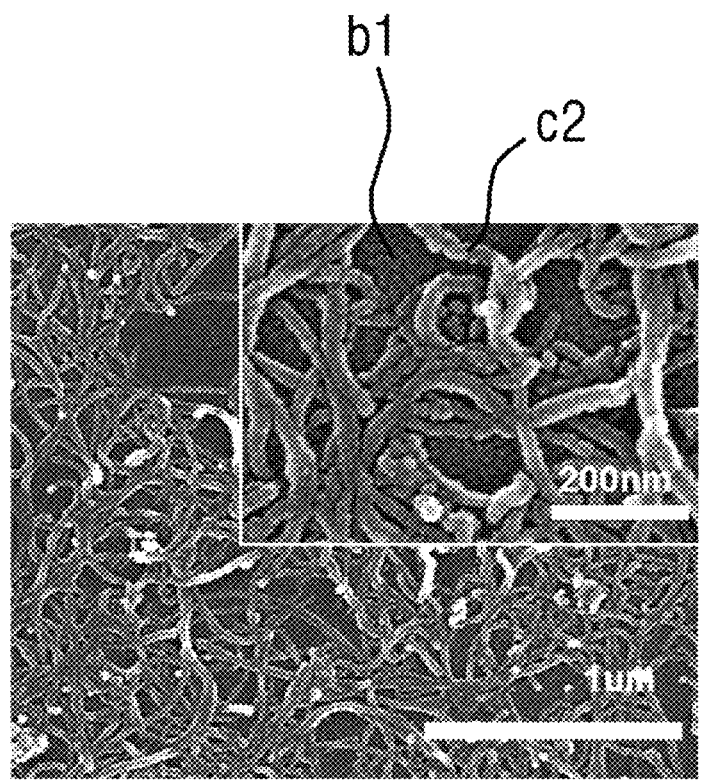

FIGS. 4A and 4B are electron micrographs for explaining a polymer binder contained in the hard mask composition according to some example embodiments of the present disclosure.

More specifically, FIG. 4A shows a hard mask layer 11 on which only CNTs c1 exist, and FIG. 4B shows a hard mask layer 11 on which CNTs c2 and a polymer binder b1 both exist.

Referring to FIGS. 4A and 4B, in a case in which the hard mask composition according to some example embodiments of the present disclosure comprises the polymer binder b1, the polymer binder b1 may fill the gaps among the CNTs c2, i.e., the gaps among the first CNTs Sc and the second CNTs Lc. Accordingly, a hard mask layer 11 with a further uniform surface may be formed.

The weight ratio of the polymer binder b1 to the hard mask composition according to some example embodiments of the present disclosure may be 20 wt % or less. If the weight ratio of the polymer binder b1 to the hard mask composition according to some example embodiments of the present disclosure is more than 20 wt %, the etching durability of the hard mask layer 11 may be degraded.

The weight ratio of the polymer binder b1 to the hard mask composition according to some example embodiments of the present disclosure may be ¼ times or less the weight ratio of the first CNTs Sc and the second CNTs Lc to the hard mask composition according to some example embodiments of the present disclosure. If the weight ratio of the polymer binder b1 to the hard mask composition according to some example embodiments of the present disclosure is more than ¼ times the weight ratio of the first CNTs Sc and the second CNTs Lc to the hard mask composition according to some example embodiments of the present disclosure, the etching durability of the hard mask layer 11 may be degraded.

The first length may be smaller than the second length, and the second length may be at least 3 times longer than the first length.

Hard mask patterns are formed (S120) by patterning the hard mask layer 11.

Figure 5:
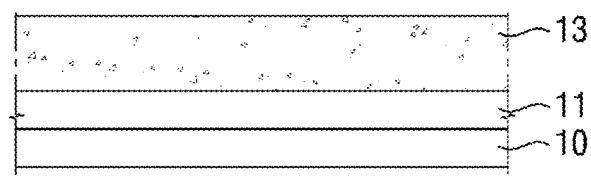

More specifically, referring to FIGS. 1 and 5, a photoresist layer 13 is formed on the hard mask layer 11 in order to pattern the hard mask layer 11.

The photoresist layer 13 may be formed by chemical vapor deposition (CVD), spin coating, plasma-enhanced CVD (PECVD), or high-density plasma CVD (HDP-CVD).

The photoresist layer 13 may be formed on the hard mask layer 11 to have a thickness of 30 nm to 60 nm. For example, the photoresist layer 13 may be formed on the hard mask layer 11 to have a thickness of 50 nm, but the present disclosure is not limited thereto. The thickness of the photoresist layer 13 may be determined in consideration of the size of patterns to be formed.

In a case in which the photoresist layer 13 is formed by spin coating, the photoresist layer 13 may be formed to a desired thickness by spraying photoresist over the hard mask layer 11 while spinning the hard mask layer 11 at low speed and accelerating the speed of spinning the hard mask layer 11 to a particular level to spin the hard mask layer 11 at high speed. Once the photoresist layer 13 is formed to the desired thickness, photoresist residues may be removed by spinning the hard mask layer 11 at low speed.

Before the formation of the photoresist layer 13 on the hard mask layer 11 or the semiconductor substrate 10, the surface of the hard mask layer 11 or the semiconductor substrate 10 may be subjected to chemical treatment in order to improve the adhesion of the photoresist layer 13 thereto. The chemical treatment may be hexamethyldisilazane (HMDS) treatment. If the surface of the hard mask layer 11 or the semiconductor substrate 10 is hydrophilic, the surface of the hard mask layer 11 or the semiconductor substrate 100 may become hydrophobic through the chemical treatment, and as a result, the adhesion of the photoresist layer 13 to the hard mask layer 11 or the semiconductor substrate 100 may be improved.

Figure 6:
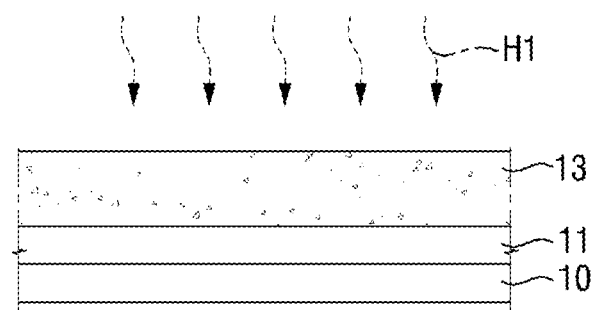

Referring to FIG. 6, a first baking process H1 may be performed.

In the first baking process H1, an organic solvent contained in the photoresist layer 13 may be removed by applying heat to the photoresist layer 13 on the hard mask layer 11.

For example, the first baking process H1 may be performed at a temperature of about 50° C. to about 250° C. for about 30 minutes to about 180 minutes so as to remove the organic solvent contained in the photoresist layer 13. The first baking process H1 may increase the density of the photoresist layer 13 and may thus lower the sensitivity of the photoresist layer 13 to environmental changes, prevent the contamination of exposure equipment and a mask with any remaining organic solvent, and uniformly maintain the photosensitive reaction properties of the photoresist layer 13.

Figure 7:
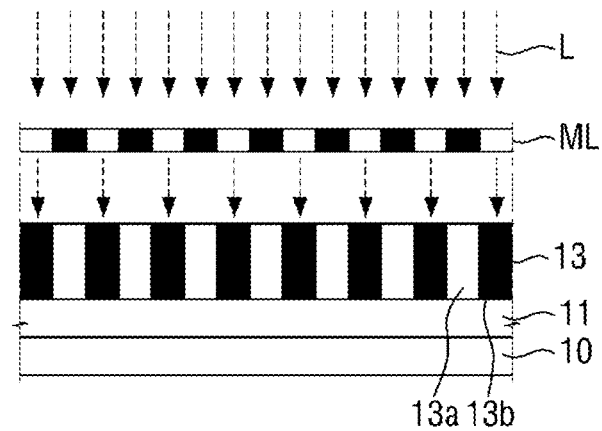

Referring to FIG. 7, patterns are formed by exposing the photoresist layer 13.

More specifically, first patterns 13a and second patterns 13b may be formed by placing a photomask ML for forming patterns over the photoresist layer 13 and applying light L.

The first patterns 13a may correspond to areas not irradiated with the light L, and the second patterns 13b may correspond to areas irradiated with the light L. In a case in which the photoresist layer 13 is a positive photoresist layer, the areas irradiated with the light L cause a chemical reaction and are thus removed by a developing solution. On the other hand, in a case in which the photoresist layer 13 is a negative photoresist layer, the areas not irradiated with the light L are removed by the developing solution.

In the following description, it is assumed that the photoresist layer 13 is a positive photoresist layer, but the present disclosure is not limited thereto.

For example, the photoresist layer 13 may be subjected to extreme ultraviolet (EUV) exposure to form fine patterns, and the light L may be applied using an I-line, krypton fluoride (KrF) or argon fluoride (ArF) light source. However, the present disclosure is not limited to this example.

The photoresist layer 13 has been described above as being subjected to exposure using the photomask ML, but the present disclosure is not limited thereto. That is, alternatively, the photoresist layer 13 may be subjected to exposure not using a photomask, i.e., "maskless" exposure.

Figure 8:
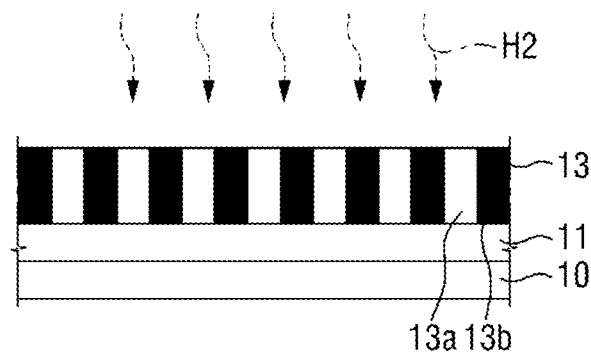

Referring to FIG. 8, a second baking process H2 may be performed.

The photoresist layer 13 may be dried by the second baking process H2. The second baking process H2 may be performed at a temperature of about 50° C. to about 250° C. for about 50 minutes to about 250 minutes, but the present disclosure is not limited thereto.

As a result of the second baking process H2, a chemical amplification reaction may occur in the photoresist layer 13. For example, if the photoresist layer 13 is an ArF photoresist layer using a wavelength of 193 nm, the photoresist layer 13 may be a chemically amplified resist layer, in which case, the second baking process H2 may affect the sensitivity of the photoresist layer 13. However, the present disclosure is not limited to this example.

Figure 9:
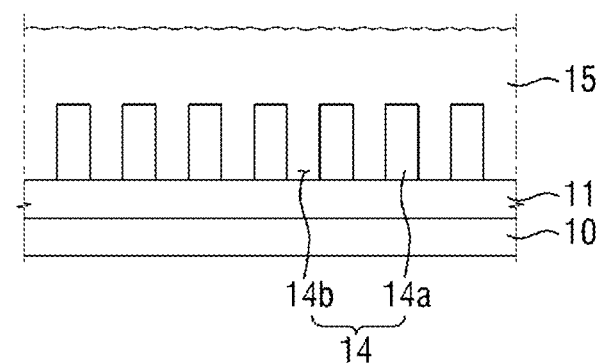

Referring to FIG. 9, photoresist patterns 14 are formed by applying a developing solution 15 to the photoresist layer 13 (S120).

The photoresist pattern 14 may include pattern portions 14a and recess portions 14b. If the photoresist layer 13 is a positive photoresist layer, the first patterns (13a of FIG. 6) may become the pattern portions 14a, and the second patterns (13b of FIG. 6) may be removed to form the recess portions 14b.

The developing solution 15 may be, but is not limited to, a water-soluble alkali solution such as, for example, a tetramethyl-ammonium-hydroxide (TMAH) aqueous solution, n-butyl acetate (BA), or 2-heptanone.

The duration for which to develop the photoresist layer 13 using the developing solution 15 may be determined in consideration of the thickness of the photoresist layer 13.

Figure 10:
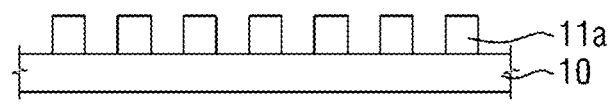

Referring to FIG. 10, hard mask patterns 11a are formed using the photoresist patterns 14.

For example, the developing solution 15 of FIG. 9 may be removed by spin coating, and after the removal of the developing solution 15, a rinsing process may be additionally performed using a rinsing solution. However, the present disclosure is not limited to this example. In a case in which a rinsing process is additionally performed using a rinsing solution, deionized (DI) water or an organic solvent may be used as the rinsing solution, but the present disclosure is not limited thereto.

Thereafter, semiconductor patterns are formed (S130) by etching the semiconductor substrate 10 using the hard mask patterns 11a.

Figure 11:
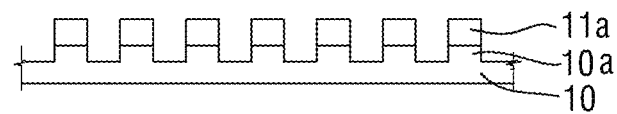
Figure 12:
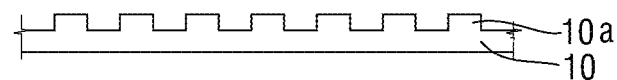

More specifically, referring to FIGS. 10 through 12, the semiconductor substrate 10 is etched using the hard mask patterns 11a. Thereafter, the semiconductor patterns 10a may be formed by removing the hard mask patterns 11a from the semiconductor substrate 10.

The semiconductor substrate 10 may be etched by dry etching or wet etching. For example, the semiconductor substrate 10 may be etched by plasma etching using carbon tetrafluoride ($CF_4$), but the present disclosure is not limited thereto.

As mentioned above, the hard mask patterns 11a are mask patterns formed of CNTs. Thus, the hard mask patterns 11a may have high etching durability and may thus be sustained even after a prolonged etching process during the formation of the semiconductor patterns 10a.

The etching durability of the hard mask patterns 11a will hereinafter be described with reference to FIGS. 13(a) through 13(d).

FIGS. 13(a) through 13(d) are graphs or photos for explaining the etching durability of hard mask patterns according to some example embodiments of the present disclosure.

Figure 13:
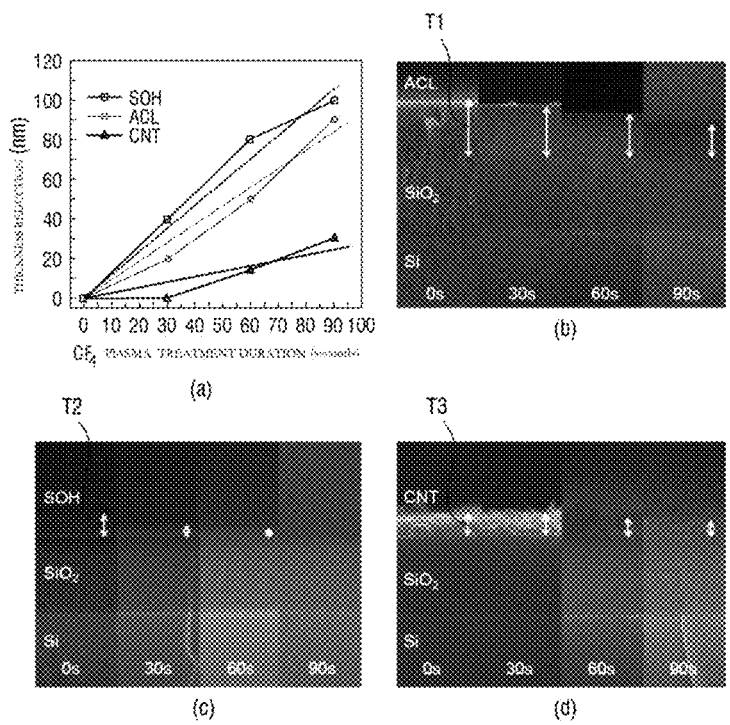
FIGS. 13(a) through 13(d) are graphs or photos for explaining the etching durability of hard mask patterns according to some example embodiments of the present disclosure.

More specifically, FIG. 13(a) is a graph showing the etching speeds of a spin-on-hard mask layer SOH, an amorphous carbon layer ACL, and a hard mask pattern layer CNT according to the present disclosure during a $CF_4$ plasma treatment process. FIG. 13(b) is a photo showing changes, over time, in a thickness T1 of the amorphous carbon layer ACL. FIG. 13(c) is a photo showing changes, over time, in a thickness T2 of the spin-on-hard mask layer SOH. FIG. 13(d) is a photo showing changes, over time, in a thickness T3 of the hard mask pattern layer CNT. The $CF_4$ plasma treatment process was performed by supplying a $CF_4$ gas at a flow rate of 10 sccm under a chamber pressure of 10 mTorr with a power of 80 W.

Referring to FIG. 13(a), when the $CF_4$ plasma treatment process continued for 90 seconds, the thickness T1 of the spin-on-hard mask layer SOH was reduced by about 100 nm, the thickness T2 of the amorphous carbon layer ACL was reduced by about 90 nm, and the thickness T3 of the hard mask pattern layer CNT was reduced by about 30 nm. It may be understood that the hard mask pattern layer CNT has excellent etching durability, compared to the spin-on-hard mask layer SOH and the amorphous carbon layer ACL.

Referring to FIGS. 13(b) through 13(d), the thickness T3 of the hard mask pattern layer CNT shows a minimum reduction within a given period of time.

As is apparent from FIGS. 13(a) through 13(d), hard mask patterns comprising CNTs, according to the present disclosure, have improved etching durability. Thus, even in a case in which a layer of semiconductor patterns or a hard mask layer for forming patterns is relatively thin, etching processes may be performed with high reliability.

Figure 14:
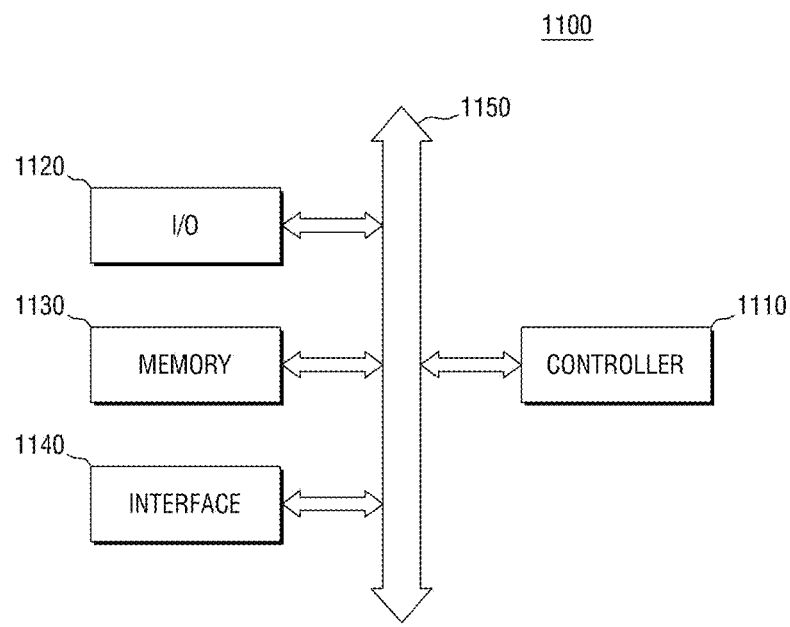
FIG. 14 is a block diagram of an electronic system including a semiconductor device manufactured according to some example embodiments of the present disclosure.

FIG. 14 is a block diagram of an electronic system including a semiconductor device manufactured according to some example embodiments of the present disclosure.

Referring to FIG. 14, an electronic system 1100 may include a controller 1110, an input/output (I/O) device 1120, a memory device 1130, an interface 1140, and a bus 1150. The controller 1110, the I/O device 1120, the memory device 1130 and/or the interface 1140 may be connected to each other through the bus 1150. The bus 1150 corresponds to a path through which data is transferred.

The controller 1110 may include at least one of a microprocessor, a digital signal processor, a microcontroller, and logic elements that can perform similar functions. The I/O device 1120 may include a keypad, a keyboard, and a display device. The memory device 1130 may store data and/or commands. The interface 1140 may transmit data to, or receive data from, a communication network. The interface 1140 may be of a wired or wireless type. For example, the interface 1140 may include an antenna or a wire/wireless transceiver. Although not specifically illustrated, the electronic system 1100 may include a high-speed dynamic random access memory (DRAM) and/or static random access memory (SRAM) as an operating memory for improving the operation of the controller 1110. A semiconductor device obtained by the manufacturing method according to some example embodiments of the present disclosure may be provided inside the memory device 1130 or may be provided as part of the controller 1110 or the I/O device 1120.

The electronic system 1100 may be applicable to a personal digital assistant (PDA), a portable computer, a web tablet, a wireless phone, a smart phone, a mobile phone, a digital music player, a memory card, or any type of electronic product capable of transmitting and/or receiving information in a wireless environment.

Figure 15:
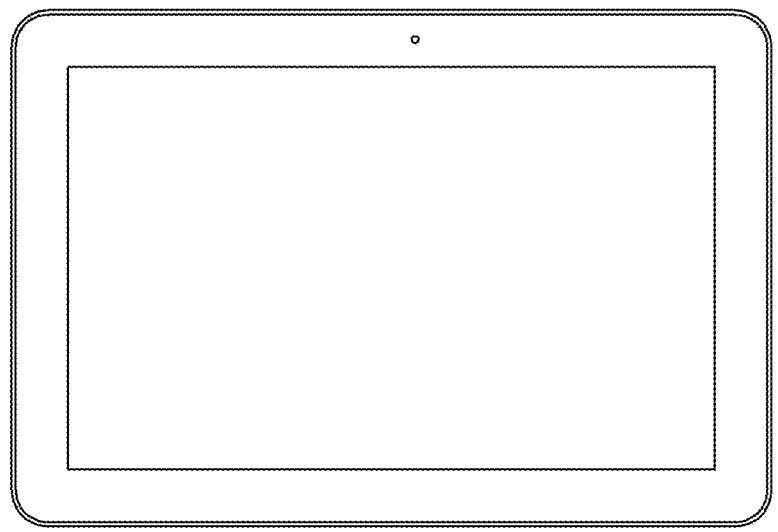
FIG. 15 is a schematic view of an example semiconductor system to which the semiconductor device obtained by the manufacturing method according to some example embodiments of the present disclosure is applicable.

FIG. 15 is a schematic view of an example semiconductor system to which the semiconductor device obtained by the manufacturing method according to some example embodiments of the present disclosure is applicable. More specifically, FIG. 15 illustrates a tablet PC. The semiconductor device obtained by the manufacturing method according to some example embodiments of the present disclosure may be used in a tablet PC or a notebook computer. However, it is obvious that the semiconductor device obtained by the manufacturing method according to some example embodiments of the present disclosure may also be used in various integrated circuit (IC) devices other than those set forth herein.

In some embodiments of the present disclosure, the forming the hard mask layer, comprises forming a hard mask layer having a coating uniformity of 50 Å to 100 Å.

In some embodiments of the present disclosure, the hard mask composition further comprises a surfactant.

In some embodiments of the present disclosure, the hard mask composition further comprises a surfactant mixed with the dispersing agent.

In some embodiments of the present disclosure, the forming the hard mask layer, further comprises removing the dispersing agent by heating the hard mask composition spin-coated on the semiconductor substrate.

In some embodiments of the present disclosure, the first CNTs and the second CNTs include at least one selected from the group consisting of single-wall CNTs, double-wall CNTs, thin multiwall CNTs, and multiwall CNTs.

In some embodiments of the present disclosure, the CNT layer is a patterned CNT layer.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

The example embodiments of the present disclosure have been described with reference to the accompanying drawings. However, those skilled in the art will appreciate that many variations and modifications can be made to the disclosed embodiments without substantially departing from the principles of the present disclosure. Therefore, the disclosed embodiments of the present disclosure are used in a generic and descriptive sense only and not for purposes of limitation.

What is claimed is:

1. A manufacturing method of a semiconductor device, the method comprising:
    forming a hard mask layer on a semiconductor substrate using a hard mask composition;
    forming hard mask patterns by patterning the hard mask layer; and
    forming semiconductor patterns by etching the semiconductor substrate using the hard mask patterns, wherein:
    the hard mask composition comprises a plurality of first carbon nanotubes (CNTs) having a first length, a plurality of second CNTs having a second length, which is at least 3 times the first length, and a dispersing agent in which the first CNTs and the second CNTs are dispersed, and
    a total mass of the first CNTs is 1 to 2.5 times a total mass of the second CNTs.

2. The manufacturing method of claim 1, wherein the first length is 150 nm to 300 nm.

3. The manufacturing method of claim 2, wherein the second length is 1 μm to 10 μm.

4. The manufacturing method of claim 1, wherein:
    the hard mask composition further comprises a polymer binder; and
    the polymer binder fills gaps among the first CNTs and the second CNTs during the forming of the hard mask layer.

5. The manufacturing method of claim 4, wherein a weight ratio of the polymer binder to the hard mask composition is 20 wt % or less.

6. The manufacturing method of claim 4, wherein a weight ratio of the polymer binder to the hard mask composition is ¼ times or less a weight ratio of the first CNTs and the second CNTs to the hard mask composition.

7. The manufacturing method of claim 1, wherein the forming of the hard mask layer, comprises forming the hard mask layer to have a coating uniformity of 50 Å to 100 Å.

8. The manufacturing method of claim 1, wherein the hard mask composition further comprises a surfactant.

9. A manufacturing method of a semiconductor device, the method comprising:
    dispersing a plurality of first carbon nanotubes (CNTs) having a first length and a plurality of second CNTs having a second length, different from the first length, within a dispersing agent to produce a hard mask composition;
    forming a layer of the hard mask composition on a semiconductor substrate;
    forming hard mask patterns by patterning the hard mask layer; and
    forming semiconductor patterns by etching the semiconductor substrate using the hard mask patterns.

10. The method of claim 9, wherein the second length is at least 3 times greater than the first length.

11. The method of claim 9, wherein a total mass of the first CNTs is 1 to 2.5 times a total mass of the second CNTs.

12. The method of claim 9, further comprising dispersing a polymer binder with the first CNTs and the second CNTs in the dispersing agent.

13. The method of claim 12, wherein a weight ratio of the polymer binder to the hard mask composition is 20 wt % or less.

* * * * *